United States Patent
Ohkubo

[11] Patent Number: 5,832,018
[45] Date of Patent: Nov. 3, 1998

[54] SEMICONDUCTOR LASER DEVICE

[75] Inventor: Michio Ohkubo, Kanagawa, Japan

[73] Assignee: The Furukawa Electric Co., Ltd., Tokyo, Japan

[21] Appl. No.: 796,789

[22] Filed: Feb. 6, 1997

[30] Foreign Application Priority Data

Feb. 8, 1996 [JP] Japan .................................. 8-022173

[51] Int. Cl.$^6$ ...................................................... H01S 3/19
[52] U.S. Cl. ................................................. 372/45; 372/46
[58] Field of Search .................................. 372/44, 45, 46

[56] References Cited

U.S. PATENT DOCUMENTS

| | | | |
|---|---|---|---|
| 5,088,099 | 2/1992 | Chen et al. | 372/45 |
| 5,155,738 | 10/1992 | Ijichi et al. | 372/45 |
| 5,263,040 | 11/1993 | Hayakawa | 372/45 |
| 5,408,487 | 4/1995 | Uchida et al. | 372/45 |
| 5,583,878 | 12/1996 | Shimizu et al. | 372/45 |

FOREIGN PATENT DOCUMENTS 03-194987  8/1991  Japan .......................... 372/45

08-56045  2/1996  Japan .......................... 372/45

OTHER PUBLICATIONS

Sagawa et al, "Advantages of InGaAsP Separate Confinement Layer in 0.98 um InGaAs/GaAs/InGaP Strained DQW Lasers for High Power Operation at High Temperature", Electronics Letters, vol. 28, No. 17, pp. 1639–1640, Aug. 13, 1992.

*Primary Examiner*—Rodney B. Bovernick
*Assistant Examiner*—Quyen Phan Leung
*Attorney, Agent, or Firm*—Helfgott & Karas, PC.

[57] ABSTRACT

A semiconductor laser device has a GaAs substrate (11), a single- or multiple-quantum well (QW) structure including at least one InGaAs strained QW active layer (16), a pair of GaAsP or $In_zGa_{1-z}AsP$ barrier layers (15,17) ($z \leq 0.3$) interposing therebetween the QW structure, and a pair of AlGaAs cladding layers (13, 19) sandwiching the pair of barrier layers (15,17) and the QW structure as a whole. The semiconductor laser prevents a catastrophic optical damage (COD) caused by recombination current due to the presence of aluminum and exhibits a high optical output power.

11 Claims, 1 Drawing Sheet

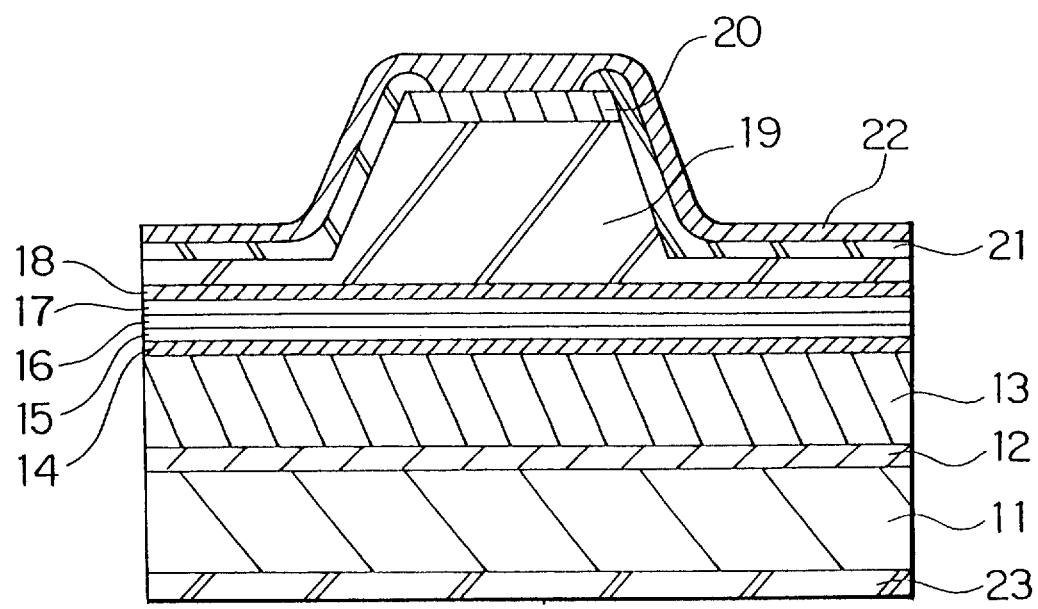

SEMICONDUCTOR LASER DEVICE

BACKGROUND OF THE INVENTION (a) Field of the Invention

The present invention relates to a semiconductor laser device and, more particularly, to a semiconductor laser device of an excellent reliability.

(b) Description of the Related Art

A GaAs based quantum well (QW) semiconductor laser device having a QW structure including an InGaAs QW active layer is generally used in a light source for exciting an optical fiber doped, for example, with Erbium and now being developed by active researches. This type of semiconductor laser, however, is susceptible to a catastrophic optical damage (referred to as COD hereinafter) in the vicinity of the cleaved facets of the laser device to be decayed in a very short time, to degrade reliability of the semiconductor laser device.

It is believed that the COD is caused by current flowing through a non-radiative recombination center, which is located in the vicinity of the cleaved facets of the active layer and has an energy level within the bandgap energy of the active layer. Therefore, it is important to reduce the density of the recombination center of the active layer and optical confinement layers constituting the semiconductor laser elements, in order to suppress the COD.

Some conventional GaAs based QW semiconductor lasers are of the QW structure that includes an InGaAs QW active layer and corresponding GaAs barrier layers, a pair of InGaP cladding layers and a pair of InGaAsP optical confinement layers. This type of QW structure advantages in that the COD failure can be suppressed in the absence of aluminum at the exposed facets of the laser device: aluminum is known to generate recombination centers. The QW laser is, however, not suited to a high output semiconductor laser device because each of InGaP and InGaAsP has a lower thermal conductivity being a half of what AlGaAs has, or less.

On the other hand, a GaAs based QW semiconductor laser device including an AlGaAs cladding layer has an advantage of excellent laser characteristics such as a high thermal conductivity, a high hole mobility, and a low resistance due to its low offset in the valence band in the vicinity of the active layer. The GaAs based QW laser has, however, GaAs or AlGaAs optical confinement layers that tend to allow excess recombination current to be induced in the vicinity of the facets of the optical confinement layers, thereby forming a disadvantage from the COD view point. To alleviate the disadvantage, it is thinkable to apply instead InGaAsP optical confinement layers, which unfortunately pose another problem of a high serial resistance due to a large offset in the valence band in the vicinity of the active layer.

SUMMARY OF THE INVENTION

In view of the above, it is an object of the present invention to provide a GaAs based QW semiconductor laser device which is capable of outputting a high optical power and less susceptible to the COD failure.

According to a first aspect of the present invention, there is provided a semiconductor laser device comprising a GaAs substrate and a laser structure formed on the GaAs substrate, the laser structure including an active layer body having at least one InGaAs strained quantum well active layer, a pair of GaAsP barrier layers with the active layer body interposed therebetween, and a pair of AlGaAs cladding layers with the GaAsP barrier layers and the active layer body interposed therebetween.

According to a second aspect of the present invention, there is provided a semiconductor laser device comprising a GaAs substrate and a laser structure formed on the GaAs substrate, the laser structure including an active layer body having at least one InGaAs strained quantum well active layer, a pair of $In_zGa_{1-z}AsP$ barrier layers, wherein z is not higher than 0.3, interposing the active layer body therebetween, and a pair of AlGaAs cladding layers interposing the GaAsP barrier layers and the active layer body therebetween.

In accordance with the semiconductor laser device according to the first aspect of the present invention, the pair of GaAsP barrier layers, provided adjacent to the active layer body, functions for suppressing the COD by reducing the recombination current in the vicinity of the facets of the active layer to thereby provide a semiconductor laser device of a high optical output power.

In the second aspect of the present invention, the $In_zGa_{1-z}AsP$ barrier layers, wherein z is not higher than 0.3, are provided instead of the GaAsP barrier layers in the first aspect of the present invention for similarly suppressing the COD.

In the semiconductor laser device according to the present invention, the active layer body including the InGaAs strained QW active layer may be formed as a single QW (SQW) layer as well as a multiple QW (MQW) structure together with the adjacent barrier layers. The pair of barrier layers may interpose therebetween the active layer body formed as a single InGaAs strained QW active layer in the case of a SQW laser device. The pair of barrier layers may interpose therebetween the active layer body including a plurality of active layers and corresponding other barrier layers to form a MQW structure in the case of a MQW laser device. In the latter case, barrier layers other than the specific pair of barrier layers interposing therebetween the active layer body may be GaAs layer instead of GaAsP or $In_zGa_{1-z}AsP$ wherein z is not higher than 0.3.

BRIEF DESCRIPTION OF THE DRAWINGS

The FIGURE is a cross-sectional view of a semiconductor laser device according to an embodiment of the present invention.

DESCRIPTION OF THE PREFERRED EMBODIMENT

Before describing the preferred embodiment of the present invention, the principle of the present invention is described for a quick grip on the present invention.

The present invention is supported by a principle reduced through our experiments. The findings teach that a pair of GaAsP barrier layres or $In_zGa_{1-z}AsP$ barrier layers ($z \leq 0.3$), if laid out adjacent to an InGaAs strained QW active layer, prevented the increase of the recombination current. As a result, the COD failure turned out to be suppressible, to thereby suppress the COD failure, where a pair of cladding layers interposing therebetween the QW structure is made of AlGaAs which has a high thermal conductivity. Some effect of the GaAsP or InGaAsP barrier layers is believed to suppress the recombination current, as described hereinafter.

In general, when the surface of a compound semiconductor, such as a cleaved facet of a semiconductor laser, is exposed to air, oxygen is adsorbed to the compound semiconductor to form an oxide film on the surface of the compound semiconductor. The thus oxidized surface functions as a recombination center, wherein it is believed that the density of recombination centers lessens as the As content in the GaAs reduces. Accordingly, the density of recombination centers declines in a sequence of GaAs>GaAsP>InGaP.

Since a recombination center locates its energy level within the bandgap energy, the larger the bandgap, the larger the energy difference between the energy levels of the band end and the recombination center. The bandgap energy is larger in GaAs than in InGaAs constituting the active layer, and also, is larger in GaAsP than in GaAs, which tendency can be more emphasized by raising the P content of GaAsP. Accordingly, a laser beam emitted from the InGaAs strained QW active layer is less absorbed to recombination centers in a GaAsP barrier layer as compared to a GaAs barrier layer, thereby suppressing the recombination current.

Considering the density of recombination centers and the wavelength of the light absorbed into the recombination center, the GaAsP barrier layers as provided adjacent to the InGaAs strained QW active layer suppress the recombination current to thereby prevent the COD failure.

Further, in the case of $In_zGa_{1-z}AsP$ barrier layers wherein z is not exceeding 0.3, the density of recombination centers therein is smaller than that in the case of GaAs, thereby preventing the recombination current from occurring. The reason for $z \leq 0.3$ is introduced therein in consideration of reducing the serial resistance.

Now, the preferred embodiment will be specifically described with reference to a single FIGURE.

Single FIGURE shows the semiconductor laser device according to the embodiment. The semiconductor laser device is comprised of consecutively and epitaxially grown layers on an n-GaAs substrate 11: a 0.5 μm-thick n-GaAs buffer layer 12, a 2.0 μm-thick n-$Al_{0.3}Ga_{0.7}As$ cladding layer 13, a 70 nm-thick $Al_{0.2}Ga_{0.8}As$ optical confinement layer 14, a 10 nm-thick $GaAs_{0.85}P_{0.15}$ barrier layer 15, a 7 nm-thick InGaAs strained QW layer constituting an active layer 16, a 10 nm-thick $GaAs_{0.85}P_{0.15}$ barrier layer 17, a 70 nm-thick $Al_{0.2}Ga_{0.8}As$ optical confinement layer 18, a 2.0 μm-thick p-$Al_{0.3}Ga_{0.7}As$ cladding layer 19, a 0.5 μm-thick p-AlAs cap layer 20. After the epitaxial growth as described above, a ridge structure is remade to have a 4 μm width and a 0.8 mm cavity length, wherein the lasing facets are as cleaved at the low reflective end and is coated at the high reflective end with a dielectric material having a high reflectance of 95% after cleavage. Following the formation of the ridge structure, a SiN coating layer 21 and a p-electrode 22 are consecutively formed on the laminate body, followed by the formation of an n-electrode 23 on the back surface of the n-GaAs substrate 11 to form the laser device of the FIGURE.

The semiconductor laser shown in the FIGURE. (Embodiment) and another semiconductor laser (Comparative Example), which had a structure similar to the Embodiment except for its GaAs barrier layers provided instead of the $GaAs_{0.85}P_{0.15}$ barrier layers 15 and 17 in the FIGURE, were fabricated.

The Embodiment and the Comparative Example underwent a comparative reliability test with an optical output power of 100 mW at the emission facet and at an ambient temperature of 60° C. The Embodiment exhibited only a faint rise of driving current less 3%, and the Comparative Example exhibited a significant rise of driving current exceeding 20%. Both resulted from 1000 hours continuous lasing, which proved a drastically stiffened reliability due to the present invention.

In the above embodiment, the active layer body is of a SQW structure having a single InGaAs strained active layer for an exemplification purpose. The active layer body in the present invention may be of a MQW structure including a plurality of InGaAs strained QW layers and corresponding other barrier layers. In the latter case, at least the specific barrier layers which are located adjacent to the active layer body should be made of $GaAs_{0.85}P_{0.15}$, for example, according to the present invention. The specific barrier layers may be made of $In_zGa_{1-z}AsP$ ($z \leq 0.3$) instead. Other barrier layers in the MQW structure may be made of GaAs.

The AlGaAs cladding layers are preferably made of $Al_xGa_{1-x}As$, given $0.2 \leq x \leq 0.4$. In this configuration, $0.2 \leq x$ provides a sufficient bandgap energy for the cladding layers, whereas $x \leq 0.4$ provides a reliable epitaxial growth for a high quality AlGaAs cladding layers.

The GaAsP barrier layers are preferably made of $GaAs_yP_{1-y}$, given $0.05 \leq y \leq 0.2$. In this configuration, $0.05 \leq y$ provides a sufficient suppression for absorption of light from InGaAs QW active layer, whereas $y \leq 0.2$ provides a reduction of strain in the interfaces between the InGaAs QW active layer and the GaAsP barrier layers.

Although the present invention is described with reference to the preferred embodiment thereof, the present invention is not limited thereto and various modifications or alterations can be easily made from the embodiment by those skilled in the art without departing from the scope of the present invention as set forth in the appended claims.

What is claimed is:

1. A semiconductor laser device comprising a GaAs substrate and a laser structure formed on said GaAs substrate, said laser structure including an active layer body having at least one InGaAs strained quantum well active layer, a pair of GaAsP barrier layers interposing therebetween said active layer body, and a pair of AlGaAs cladding layers sandwiching said GaAsP barrier layers and said active layer body.

2. A semiconductor laser device as defined in claim 1 wherein said active layer body includes a single active layer to form a single-quantum well active layer together with said barrier layers.

3. A semiconductor laser device as defined in claim 1 wherein said active layer body includes a plurality of active layers to form a multiple-quantum well structure together with said pair of barrier layers.

4. A semiconductor laser device as defined in claim 3 wherein said active layer body includes at least one GaAs barrier layer interposed between said active layers.

5. A semiconductor laser device as defined in claim 1 wherein each of said barrier layers is made of $GaAs_yP_{1-y}$ wherein y ranges between 0.05 and 0.2.

6. A semiconductor laser device as defined in claim 1 wherein each of said cladding layers is made of $Al_xGa_{1-x}As$ wherein x ranges between 0.2 and 0.4.

7. A semiconductor laser device comprising a GaAs substrate and a laser structure formed on said GaAs substrate, said laser structure including an active layer body having at least one InGaAs strained quantum well active layer, a pair of $In_zGa_{1-z}AsP$ barrier layers, given z not exceeding 0.3, interposing therebetween said active layer body, and a pair of AlGaAs cladding layers interposing therebetween said $In_zGa_{1-z}AsP$ barrier layers and said active layer body.

8. A semiconductor laser device as defined in claim 7 wherein said active layer body includes a single active layer to form a single-quantum well active layer together with said barrier layers.

9. A semiconductor laser device as defined in claim 7 wherein said active layer body includes a plurality of active layers to form a multiple-quantum well structure together with said barrier layers.

10. A semiconductor laser device as defined in claim 9 wherein said active layer body includes at least one GaAs barrier layer interposed between said active layers.

11. A semiconductor laser device as defined in claim 7 wherein each of said cladding layers is made of $Al_xGa_{1-x}As$ with x ranging between 0.2 and 0.4.

* * * * *